United States Patent
Liu et al.

(10) Patent No.: US 8,791,573 B1
(45) Date of Patent: Jul. 29, 2014

(54) SKEWED PARTIAL COLUMN INPUT/OUTPUT FLOORPLAN

(75) Inventors: Hui Liu, Pleasanton, CA (US); Christopher F. Lane, San Jose, CA (US); Arifur Rahman, San Jose, CA (US); Jianming Huang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/601,894

(22) Filed: Aug. 31, 2012

(51) Int. Cl.
*H01L 23/48* (2006.01)
*G06F 17/50* (2006.01)

(52) U.S. Cl.
USPC ........... 257/773; 257/208; 257/203; 257/207; 257/211; 257/698; 257/774; 257/784; 257/786

(58) Field of Classification Search
USPC ......... 257/773, 208, 203, 207, 211, 698, 774, 257/784, 786; 716/17, 16, 18
See application file for complete search history.

(56) References Cited

U.S. PATENT DOCUMENTS

| | | | |
|---|---|---|---|
| 7,353,487 B1 * | 4/2008 | Bergendahl et al. | 326/38 |
| 8,495,122 B2 * | 7/2013 | Simkins et al. | 708/523 |
| 2007/0288219 A1 * | 12/2007 | Zafar et al. | 703/14 |
| 2008/0320268 A1 * | 12/2008 | Wingard et al. | 711/202 |
| 2012/0012748 A1 * | 1/2012 | Pain et al. | 250/332 |

* cited by examiner

*Primary Examiner* — Alexander Oscar Williams
(74) *Attorney, Agent, or Firm* — Weaver Austin Villeneuve & Sampson LLP

(57) ABSTRACT

Techniques and mechanisms for providing embedded Input/Output (IO) blocks in a floor plan of a semiconductor device are provided, where the embedded IO blocks constitute partial columns (i.e., they do not extend from the bottom through to the top of the semiconductor device). In some embodiments, the partial column IO banks are skewed away from one another. In some embodiments, the partial column IO banks are located away from the center of the semiconductor device. Techniques and mechanisms for implementing symmetrical package routing using skewed partial column IO banks are also provided.

22 Claims, 6 Drawing Sheets

SKEWED PARTIAL COLUMN INPUT/OUTPUT FLOORPLAN

FIELD OF THE INVENTION

The present disclosure generally relates to the field of semiconductor devices, and specifically to the field of designing Input/Output (IO) interfaces of semiconductor devices.

BACKGROUND

Semiconductor fabrication processes have been developed which permit the integration of a very large number of transistors, diodes, and other circuit elements on a single integrated circuit. In semiconductor manufacture, a single semiconductor die (or chip) containing one or more integrated circuits can be packaged within a sealed package.

A semiconductor package can be a casing (made, for example, of ceramic, glass or metal) containing one or more semiconductor devices such as integrated circuits. Such packages generally provide a complex electrical lead system for connecting the integrated circuits on the die to the outside world.

To make connections between an integrated circuit and the leads of the package, wire bonds can be used, with fine wires connected from the package leads and bonded to conductive pads on the semiconductor die. At the outside of the package, wire leads may be soldered to a printed circuit board, for example, or other electrical devices, using solder balls.

A semiconductor package may have as few as two leads or contacts for devices such as diodes, or in the case of advanced microprocessors, a package may have hundreds of connections.

Many methods exist for packaging integrated circuits so that they can be electrically connected to an external device such as a printed circuit board. One method is the so called ball grid array (BGA) package. In a package configured with a Ball Grid Array (BGA), the IO connects for the package are distributed around the periphery of the package as well as over the bottom of the package. This configuration allows the BGA package to support more IO interfaces and provide more connectivity support for an integrated circuit with high circuit density and a high IO count.

Another configuration that has developed is the so-called flip chip configuration. In one example, a semiconductor device with a flip chip configuration has conductive pads formed on its bottom surface. The conductive pads might, for example, be in the form of C4 pads, and might be located on the bottom of silicon on which the semiconductor device is formed. The conductive pads are used to connect the semiconductor device to the substrate layer(s) of the semiconductor packaging. In such a configuration, electrical signals sent to or from the semiconductor device are transmitted through the conducting pads to circuitry and/or vias in the substrate layer(s) which in turn transmit the signals to or from the surface of the packaging There, the signals may be transmitted through solder balls located on the surface of the packaging which connect the semiconductor package to external devices or circuits. The conductive pads allow bonding to occur directly between the semiconductor device and the packaging, as well as providing I/O interfaces at a larger number of locations on the semiconductor device. In embodiments where such a flip chip configuration is not used, wire bonds connected to the top surface or sides of the semiconductor device may be used to connect the semiconductor device to the substrate, for example.

A semiconductor device typically has a plurality of Input/Output (IO) interfaces. The IO interfaces provide the semiconductor device with connections to external devices or systems. The configuration of these IO interfaces usually takes conventional forms. For example, IO blocks may be located on the outer edges of the semiconductor device in order to provide easy connection to routing wires which connect the semiconductor device to the outside world.

Effectively designing the location of a semiconductor device IO interfaces can produce routing efficiencies for the interconnects between the integrated circuits on the semiconductor device and the outside world. Such routing efficiencies in turn can provide cost benefits as well as improvements in device performance.

SUMMARY OF THE INVENTION

The present disclosure relates to the fabrication of semiconductor devices, and more particularly, to determining where on the floor plan of a semiconductor device to locate IO blocks. As described further below, improvements are achieved by providing partial column embedded IO banks in the core of the semiconductor device. In some embodiments, the partial column IO banks are skewed away from one another. In some embodiments, the partial column IO banks are located away from the center of the semiconductor device. Techniques and mechanisms for implementing symmetrical package routing using skewed partial column IO banks are also provided.

According to an embodiment of the present disclosure, an integrated circuit is provided which comprises at least two embedded Input/Output (IO) columns in the core of the integrated circuit, wherein the at least two embedded IO columns are each partial columns which do not extend to the edges of the integrated circuit, where the at least two embedded columns each comprise a plurality of IO blocks.

In some embodiments, the at least two embedded IO columns are located in different segments of the integrated circuit. In some embodiments, a first embedded partial column of IO blocks is located adjacent to a first set of edge IO interfaces, and a second embedded partial column of IO blocks is located adjacent to a second set of edge IO interfaces.

BRIEF DESCRIPTION OF THE DRAWINGS

Techniques and mechanisms for providing embedded IO blocks in a floor plan of a semiconductor device are provided, where the embedded IO blocks constitute partial columns (i.e., they do not extend through from the bottom to the top of the semiconductor device). In some embodiments, the partial column IO banks are skewed away from one another. In some embodiments, the partial column IO banks are located away from the center of the semiconductor device. Techniques and mechanisms for implementing symmetrical package routing using skewed partial column IO banks are also provided.

The above techniques and mechanisms, together with other features, embodiments, and advantages of the present disclosure, may best be understood by reference to the following description taken in conjunction with the accompanying drawings, which illustrate various embodiments of the present techniques and mechanisms. In the drawings, structural elements having the same or similar functions are denoted by like reference numerals.

DETAILED DESCRIPTION

Various embodiments of the present disclosure provide techniques and mechanisms for implementing a skewed partial column Input/Output (IO) floor plan for a semiconductor device. Techniques and mechanisms for implementing symmetrical package routing using a skewed partial column IO floor plan are also provided. These improvements are achieved by embedding IO blocks in the core area of the semiconductor device, and configuring the embedded IO blocks in a manner that produces more space-efficient placement of interconnect lines through the semiconductor device's packaging.

Various embodiments of the present disclosure provide techniques and mechanisms which can be applied to non-programmable devices such as Application Specific Integrated Circuits (ASICs) and Application Specific Standard Products (ASSPs), as well as Programmable Logic Devices (PLDs), Field Programmable Gate Arrays (FPGAs) and other programmable devices.

The semiconductor device field has seen a steady progression towards smaller device dimensions. While miniaturization provides significant performance benefits for integrated circuits, it has also produced practical challenges for packaging. Miniaturization has brought increased device densities, and as a result, a need for locating more densely spaced input/output electrical connections on semiconductor devices.

As described above, in a typical semiconductor device package, a semiconductor device can be mounted or positioned in a package and further connected to interconnect lines of the device package by bond wires or solder bumps using one of various techniques. In the case of ball grid array (BGA) technique, for example, electrical connections are made from the semiconductor die to the substrate with bond wires that are attached to bond pads provided on the die and the substrate. The bond pads on the substrate are electrically connected to an array of solder balls or bumps on the exterior of the semiconductor packaging using electrical interconnects (often routing wires), and the solder balls are used to bond and make electrical connection to external devices or systems, for example, a printed circuit board (PCB).

Whatever the technique used to electrically connect a semiconductor die to a printed circuit board (PCB) or other external device or system, an efficient system for electrical connection of the semiconductor die to external devices or systems—for example, one which requires less infrastructure to implement—is desirable.

The location of IO blocks on the floor plan of a semiconductor device can be an important factor in determining the complexity and density of the electrical interconnects (for example, routing wires and/or bonding pads) needed to connect the semiconductor device to the outside world. Various embodiments of the present disclosure seek to improve upon techniques for locating IO blocks in a semiconductor device.

Figure 1:
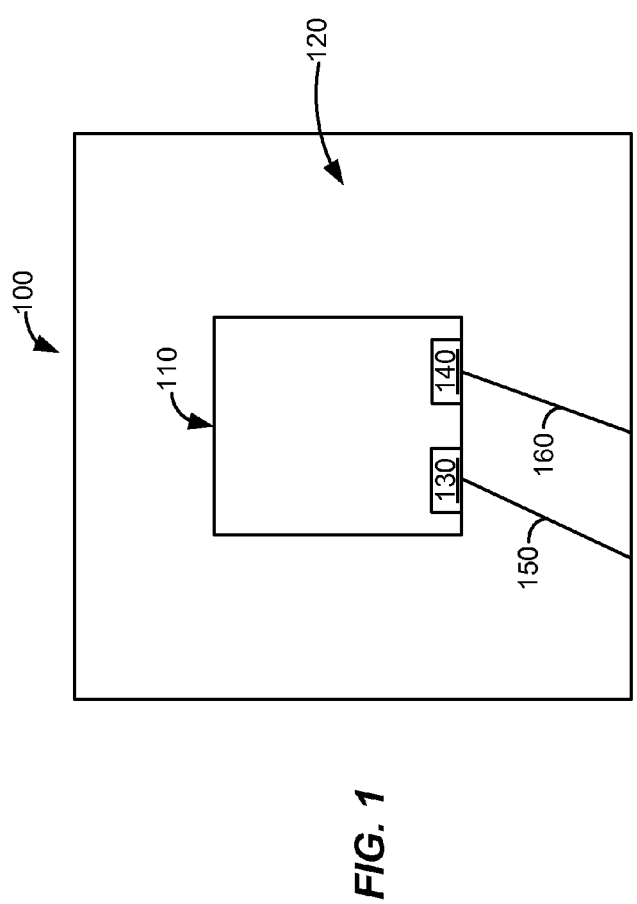
FIG. 1 is an exemplary block diagram which illustrates a top view of a horizontal cross section of a silicon semiconductor device housed in its packaging in accordance with one embodiment of the present invention.
Figure 2:
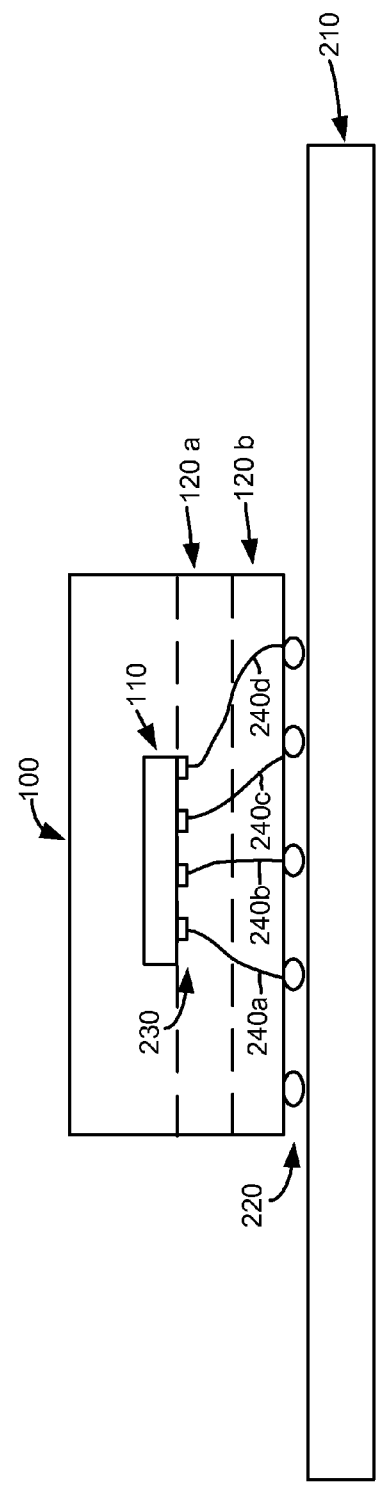
FIG. 2 is an exemplary block diagram which illustrates a vertical cross section of a silicon semiconductor device housed in its packaging and connected to a printed circuit board (PCB) in accordance with one embodiment of the present invention.

Referring now to FIGS. 1 and 2, a semiconductor device encased in packaging is shown. In particular, FIG. 1 illustrates a top view of a horizontal cross section of a silicon semiconductor device 110 housed in its packaging 120. In some embodiments, the semiconductor device 110 may consist of a silicon die on which an integrated circuit has been formed. The silicon die is thin and flat, and is generally formed in a rectangular shape. The die includes a die face, or active side, where the integrated circuit is formed.

The silicon semiconductor device 110 and the semiconductor device packaging 120 together constitute a component 100 that may be connected to other devices or systems, for example, a printed circuit board (PCB). Semiconductor device 110 has a plurality of IO blocks 130 and 140. Each IO block is connected via routing wires 150 and 160, respectively, to the surface of the semiconductor device packaging. Routing wires 150 and 160 travel through the packaging 120 and transmit electrical signals between the integrated circuit on the silicon semiconductor device 110 and external devices or systems (such as, for example, a printed circuit board) outside the semiconductor device packaging 120.

The process of packaging semiconductor devices typically starts with a substrate that is ceramic or plastic based, the devices are mounted on the surface of the substrate while one or more layers of interconnect lines and vias formed that connect the devices to surrounding circuitry within the package or outside of it. Vias are interconnections between the various metal layers made by etching holes in the insulating material.

While, ideally, the interconnect lines and vias would only require one substrate layer, in modern semiconductor devices, multiple substrate layers can be necessary to house the large number of routing lines needed to connect increasingly complex semiconductor devices to the outside world. The substrate (packaging) may be a multilayer material that includes layers of conducting and insulating materials. The conducting material containing the routing wires needed to connect the semiconductor device to the outside world. Layers of dielectric (such as polyimide) or insulating layers can separate metal layers that make up the interconnect network and the vias and contact points that establish connections between the interconnect networks.

FIG. 2 shows a view of a vertical cross section of a silicon semiconductor device housed in its packaging and connected to a printed circuit board (PCB). As shown in this view, semiconductor device 110 (which contains an integrated circuit) sits on top of the two substrate layers 120a and 120b. The substrate layers may also be referred to as packaging or routing layers. Ideally only one substrate layer is needed but, as noted above, frequently multiple substrate layers may be needed depending on the number and location of the routing lines needed to connect the semiconductor device 110 to the outside world.

Bonding pads 230 connect the electrical leads from IO interfaces of the semiconductor device 110 to the routing lines 240 that carry electrical IO signals through the packaging 120. Solder balls or bumps 220 are located on the outside of the packaging 120. Routing lines 240a and 240b for example, may provide electrical connection between bond pads 230 (which may, for example, be C4 pads) and solder balls 220. PCB 210 is attached to the packaging substrate 120 by the solder balls 220, completing the electrical connection of the semiconductor device 110 to the PCB 210.

With increasing device densities, and corresponding increases in required numbers of IO connections, semiconductor device manufacturers have looked to improvements in the design of semiconductor devices to increase the number of electrical connections.

Figure 3A:
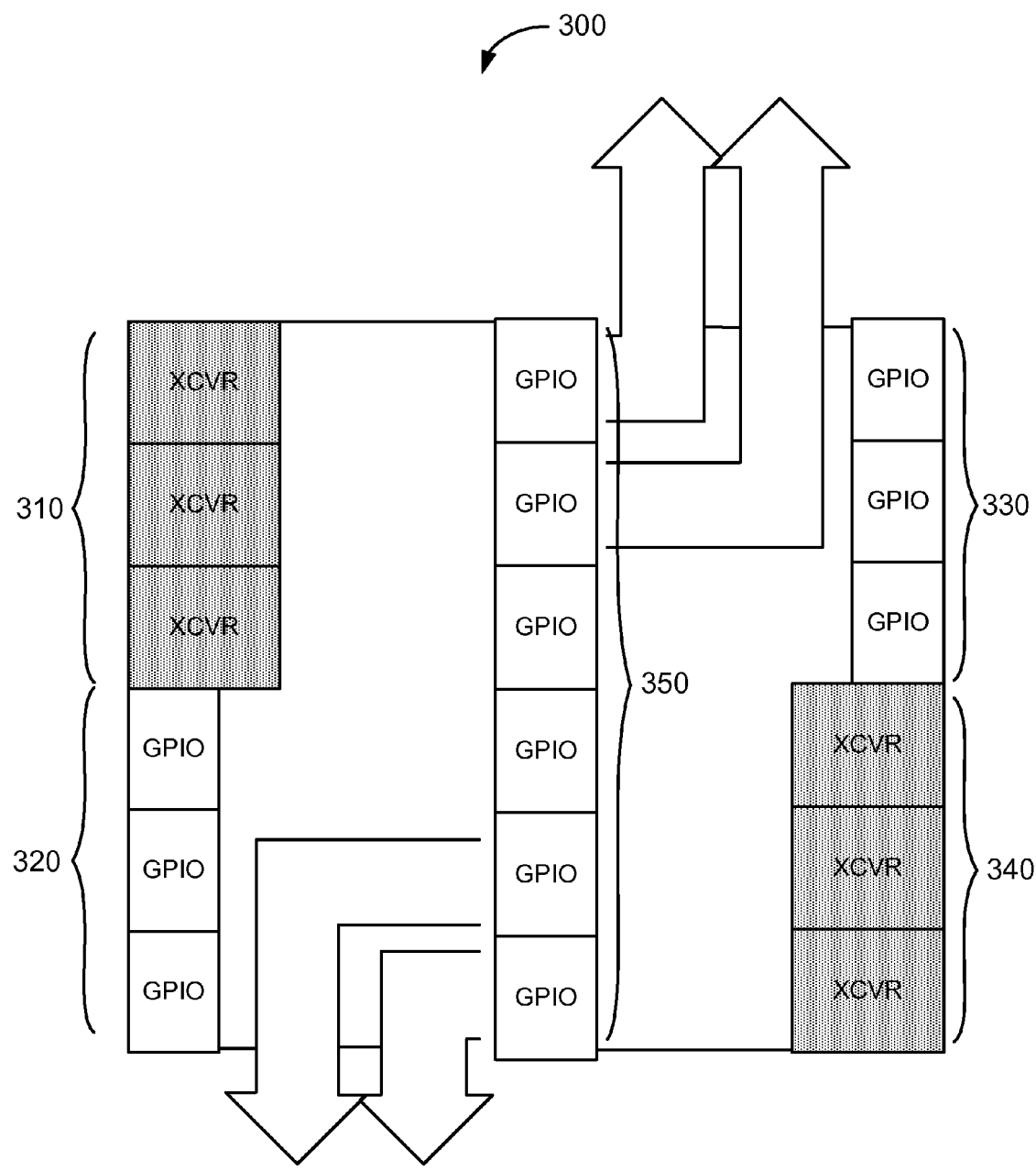
FIG. 3A is an exemplary block diagram which illustrates a top view of a horizontal cross section of a semiconductor device with an embedded full column Input/Output (IO) bank that bisects the core of the semiconductor device.

In the past, a packaged semiconductor device might have only had pads (bond pads) that were mounted, for ease of access, around the perimeter of the device. Some current solutions now also embed IO blocks in the core, or central area, of a semiconductor device. Referring now to FIG. 3A, one such solution is shown. FIG. 3A illustrates an embedded full column Input/Output (IO) bank 350 that is situated in the center of a semiconductor device.

In particular, FIG. 3A shows an integrated circuit 300 with embedded full column Input/Output (IO) bank 350. Embedded full column IO bank 350 sits in the middle of the die and extends from the top edge to the bottom edge of the semiconductor die. A number of edge IO blocks 310, 320, 330, and 340 are located on the right and left edges of the integrated circuit 300. The area inside the edge IO interfaces of a semiconductor device is often referred to as the "core" of the semiconductor device, and is usually populated with circuitry that performs the functions of the semiconductor device. The circuitry may be hard wired to perform certain functions, such as in an Application Specific Integrated Circuit (ASIC) device, or it may be built as soft logic that is configurable by the user to perform different functions, such as in a Programmable Logic Device (PLD), for example.

Having an embedded IO block located in the central part of the floor plan of the semiconductor die provides additional IO interfaces. However, the inventors found having a full column IO bank in the center of a semiconductor device can produce certain problems.

For example, assuming it is desired to implement all of the required routing in one routing (or substrate) layer, the location and shape of the edge IO interfaces 310, 320, 330, and 340 may not permit all of the IO blocks of the embedded IO bank to be bonded out on a single routing layer. That is, placement of the routing wires connecting the device to the surface of the semiconductor packaging may not be possible on just one routing layer with an IO layout that involves a full column embedded IO bank.

In the die floor plan layout shown in FIG. 3A, for example, only four of the six embedded IO blocks might be able to be routed out in one routing layer if it is desired that the routing lines for adjacent IO blocks be bonded out in the same direction. Having a uniform orientation of routing lines for adjacent IO blocks is often desirable because this layout allows for grouping IO blocks together. Such groupings can be useful, for example, where an implementation involving wider data bus widths may be necessary. It is noted that even where the routing lines are not bonded in the same direction, a correction can be made by rerouting the lines in the substrate layers, but such rerouting of signals can cause a longer critical path, and thus can cause difficulties in meeting timing requirements for the circuit.

Accordingly, the configuration shown in FIG. 3A can produce a higher routing layer (that is, substrate or packaging layer) count if it is desired to bond out all of the IO blocks of the depicted embedded full column IO bank 350, where a uniform orientation of routing lines for adjacent IO blocks is desired.

Adding more routing layers can add to the costs of manufacture and design, as well as potentially degrading the performance of the semiconductor device by increasing the distance electrical signals must travel. In the alternative, not adding additional routing layers in connection with such a layout means that not all of the embedded IO blocks may be bonded or routed out, which can produce the result that the embedded IO bank may not be capable of supporting a larger size data bus width, for example. For example, some Double Data Rate (DDR) memory modules may require a ×72 or higher data bus width.

Additionally, having an embedded IO bank located near the center of the core area results in segmentation of the core area which can lead to less effective performance of the integrated circuit.

Figure 3B:
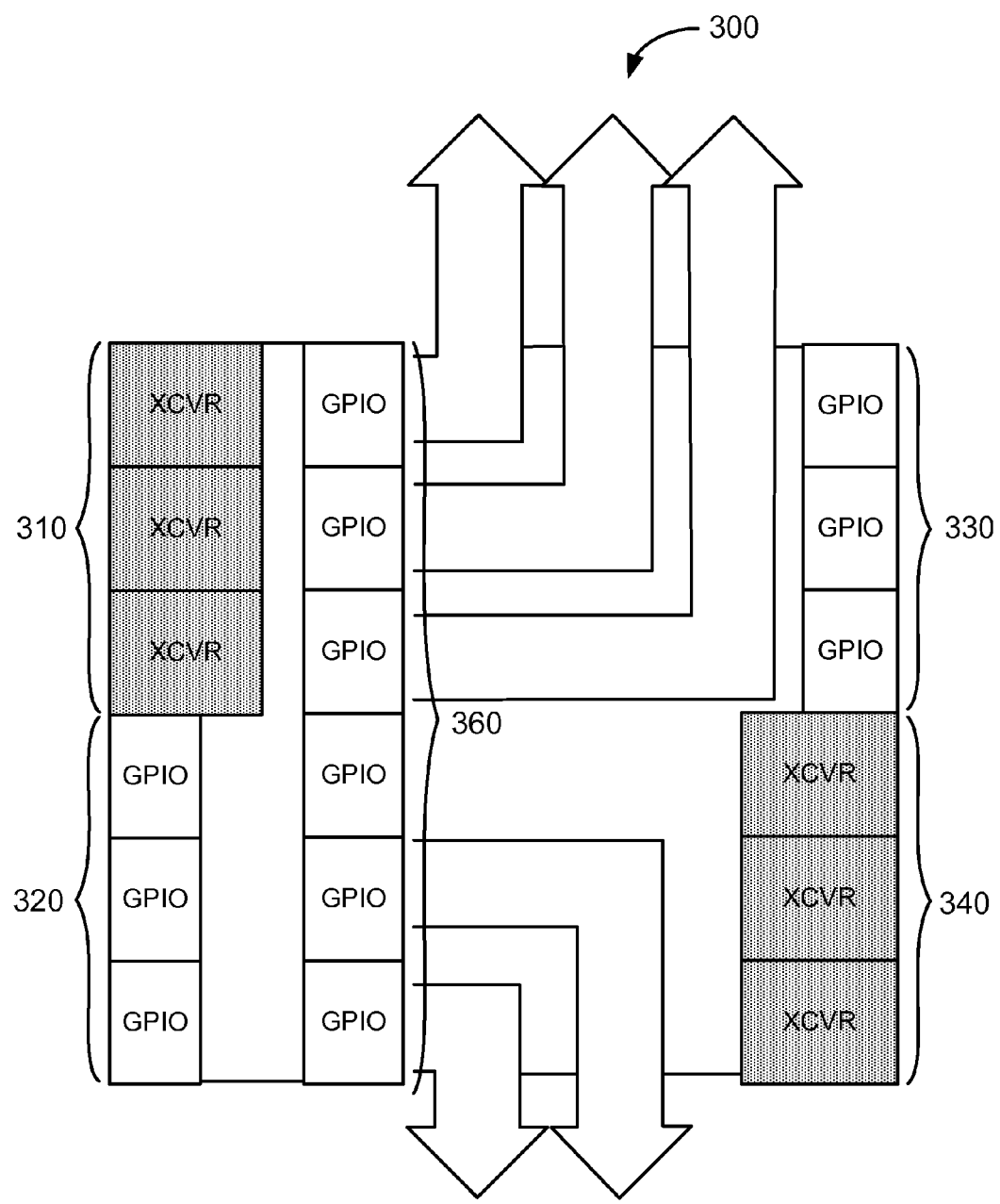
FIG. 3B is an exemplary block diagram which illustrates a top view of a horizontal cross section of a semiconductor device with an embedded full column Input/Output (IO) bank that is skewed to one side of the core of the semiconductor device.

FIG. 3B illustrates another possible floor plan for embedding a full column IO bank 360 in a semiconductor device. In this layout, embedded full column IO block 360 is skewed to one side of the core of the semiconductor device. As in the above example, the embedded IO bank extends from the top edge to the bottom edge of the semiconductor die.

In FIG. 3B, the embedded IO column 360 is skewed to one side so that it is located next to edge IO banks 310 and 320 on the left side of the semiconductor device.

The layout shown in FIG. 3B has some of the same problems as the layout shown in FIG. 3A described above. For example, as shown in FIG. 3B, while five of the IO blocks in the embedded IO column 360 may be able to be bonded out in one routing layer. The sixth IO block may not be able to be bonded out on the same routing layer as the others.

Further, the layout in FIG. 3B produces asymmetrical routing; that is, there are more routed IO interfaces in the top half of the device than in the bottom, which can be problematic when the semiconductor device is connecting to a device or system with more symmetrical connection points. The challenge can be addressed, but it requires the routing lines to travel over greater distances to correct the asymmetry in the location of the IO interfaces on the integrated circuit. The greater travel distance may cause degradation of the signal; further, the longer routing interconnects produces more complexity in the layout of the interconnects in the routing layers.

Further, the layout shown in FIG. 3B can produce the additional disadvantage that transmission of signals between the embedded IO bank 360 and edge IO interfaces on the other side of the semiconductor device (such as IO blocks 330 and 340) may take longer, and delays and degradation of the electrical signal may result. A circumstance where such delays may become a problem for example is when a signal received at edge IO interface 340 needs to be sent to a memory device out of an embedded IO interface that is part of embedded IO bank 360 now located on the other side of the die.

An improved design of a semiconductor device floor plan that provides more cost effective and efficient electrical connectivity of the semiconductor device is described below. These improvements are significant because they provide electrical connectivity without increasing the area size of a semiconductor device (that is, the x by y dimensions) or the number of substrate layers (that is the vertical z direction) needed to support the IO interfaces of the semiconductor device.

Figure 4:
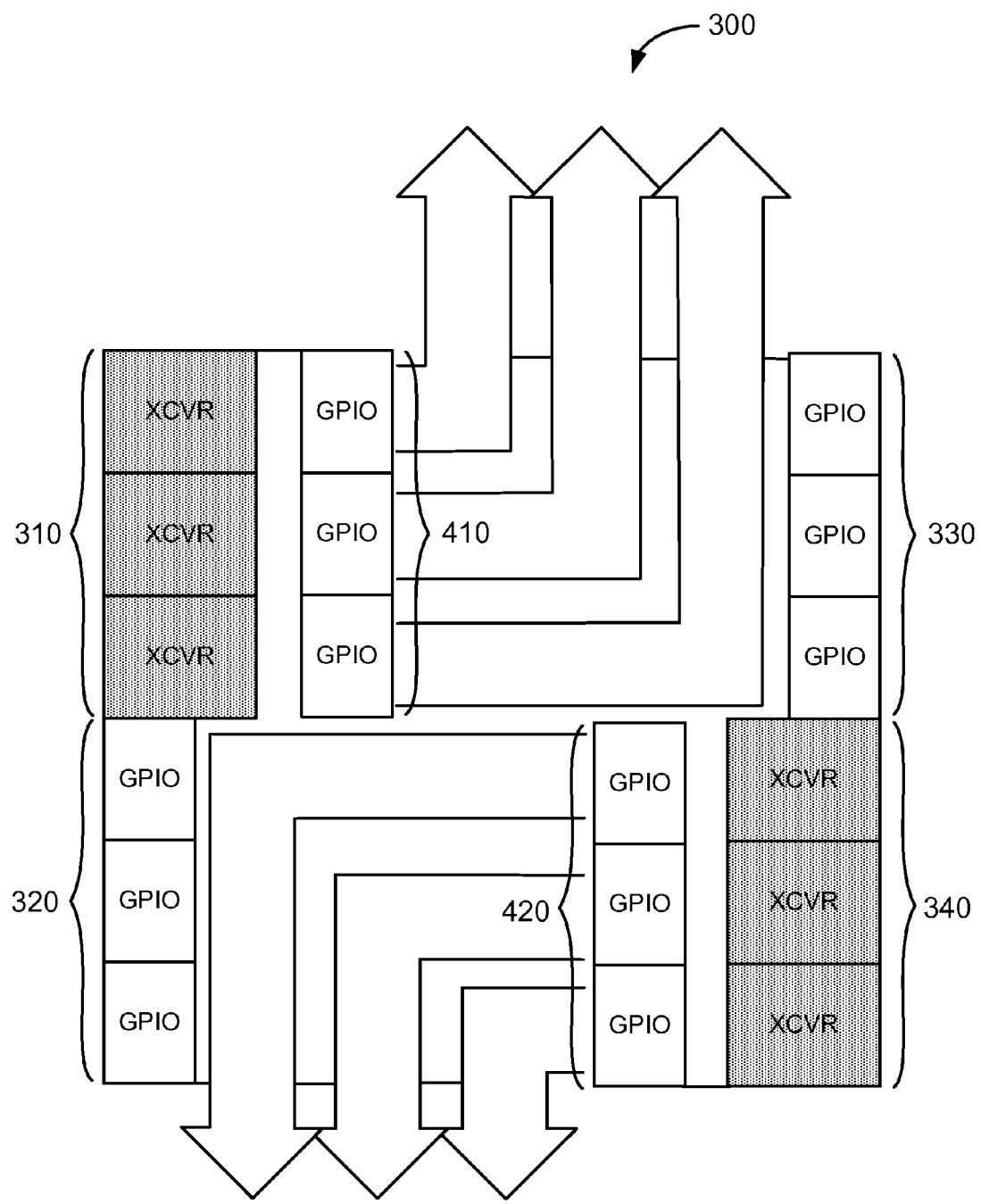
FIG. 4 is an exemplary block diagram which illustrates a top view of a horizontal cross section of a semiconductor device with two embedded partial column Input/Output (IO) banks in accordance with one embodiment of the present invention.

FIG. 4 is an exemplary block diagram illustrating embedded IO blocks according to an embodiment of the present disclosure. FIG. 4 shows two embedded IO columns in the core that are both partial (not full) column and are skewed in opposite directions. By partial column, what is meant is a column that does not extend through to the edges (for example, a top edge and a bottom edge) of an integrated circuit. In FIG. 4, a first partial column 410 skews towards the left side of the die and a second partial column 420 skews towards the right side of the die. As shown in FIG. 4, embedded partial column 410 is located on the left side, in the left half, of the integrated circuit 300 near, for example adjacent to edge IO blocks 310 and 320. And second embedded partial column 420 is located on the right side, in the right half, of the integrated circuit 300 near, for example adjacent to the edge IO blocks 330 and 340.

The design of having of two embedded partial column Input/Output (IO) banks which are skewed away from the center of a semiconductor can provide numerous benefits.

The embodiment shown in FIG. 4 allows for the use of symmetrical routing because of the symmetrical device floor plan. Therefore, this design is more easily adapted for purposes of the semiconductor device interfacing with external devices and systems such as printed circuit boards (PCBs) which also use a symmetrical design.

The embodiment shown in FIG. 4 maximizes the number of bonded IO blocks that can be supported by one routing layer, thus maximizing the number of routable embedded IO blocks that can be supported cost effectively and without impairing the electrical performance of the integrated circuit.

The embodiment shown in FIG. 4 can support larger data width bus sizes, for example, it might be able to support a ×72 data bush width DDR interface, using embedded IO blocks while at the same time maintaining minimal package substrate layer count.

The symmetrical location of the embedded partial column IO blocks in the embodiment shown in FIG. 4 enables minimum delays in transmission of packets between IO blocks of the embedded partial columns, and the edge IO blocks 310, 320, 330, and 340. By minimizing the routing delays in transmissions between edge IO interfaces and embedded IO blocks, improved device performance is achieved By providing a design in which more embedded IO blocks can be routed on the same routing layer, the embodiment shown in FIG. 4 reduces the number of required package layers, and thus reduces cost, as well as finished volume, of the component.

By providing partial embedded columns rather than full embedded columns, the embodiment shown in FIG. 4 provides for non-segmented core powers, and hence better device performance.

It will be appreciated that many variations of the above embodiments are possible without departing from the spirit of the invention described in the present disclosure. For example, the partial columns could be of different heights or widths than those depicted in FIG. 4. In addition, the partial columns need not together comprise a full column bank in the manner depicted in FIG. 4. Further, the partial columns need not be skewed so that they are adjacent to edge IO blocks in the manner depicted in FIG. 4. In other embodiments, the partial columns may not be skewed.

Figure 5:
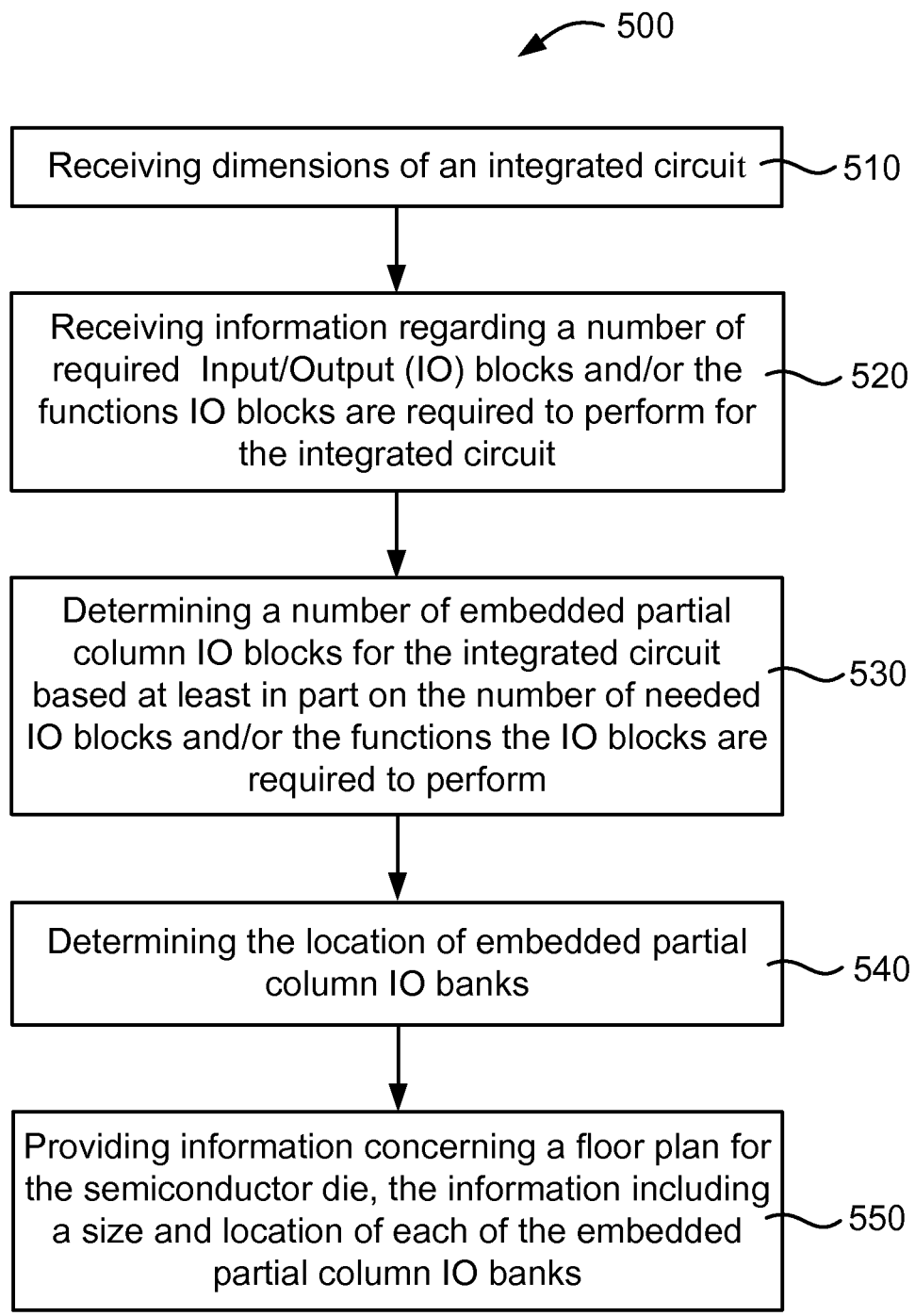
FIG. 5 is an exemplary flow diagram showing a process for determining locations and size of embedded partial column Input/Output (IO) banks in accordance with one embodiment of the present invention.

Referring to FIG. 5, a simplified flow diagram showing a process for determining locations and size of partial column embedded Input/Output (IO) columns in accordance with one embodiment of the present invention is shown.

In 510, the dimensions of the integrated circuit 400 are received.

In 520, information regarding the number of needed IO blocks and/or the functions they are required to perform for a semiconductor device is received.

In 530, a number of partial column embedded IO blocks for the semiconductor device is determined based at least in part on the number of needed IO blocks and/or the functions they are required to perform. In some embodiments, this determination involves consideration of the number of IO blocks which must be located adjacent to one another to provide data bush widths required for a desired function. In some embodiments, the size of the embedded partial column IO banks is determined at least in part by factors relating to minimizing the number of routing layers needed for implementing the semiconductor device's packaging.

In 540, the location of the partial column embedded IO blocks is determined. In some embodiments, the determination is based at least in part on factors relating to minimizing the number of routing layers needed for implementing the semiconductor device's packaging. In some embodiments, the determination is based on factors concerning minimizing segmentation of core powers and/or achieving symmetrical routing.

In 550, information concerning a floor layout for a semiconductor die including the size of the determined embedded partial column IO banks and the determined locations is provided.

As noted above, various embodiments of the present disclosure can be implemented on a semiconductor device on which an integrated circuit has been formed. The integrated circuit may take the form of an Application Specific Integrated Circuit (ASIC) or Programmable Logic Device (PLD), among other devices.

Figure 6:
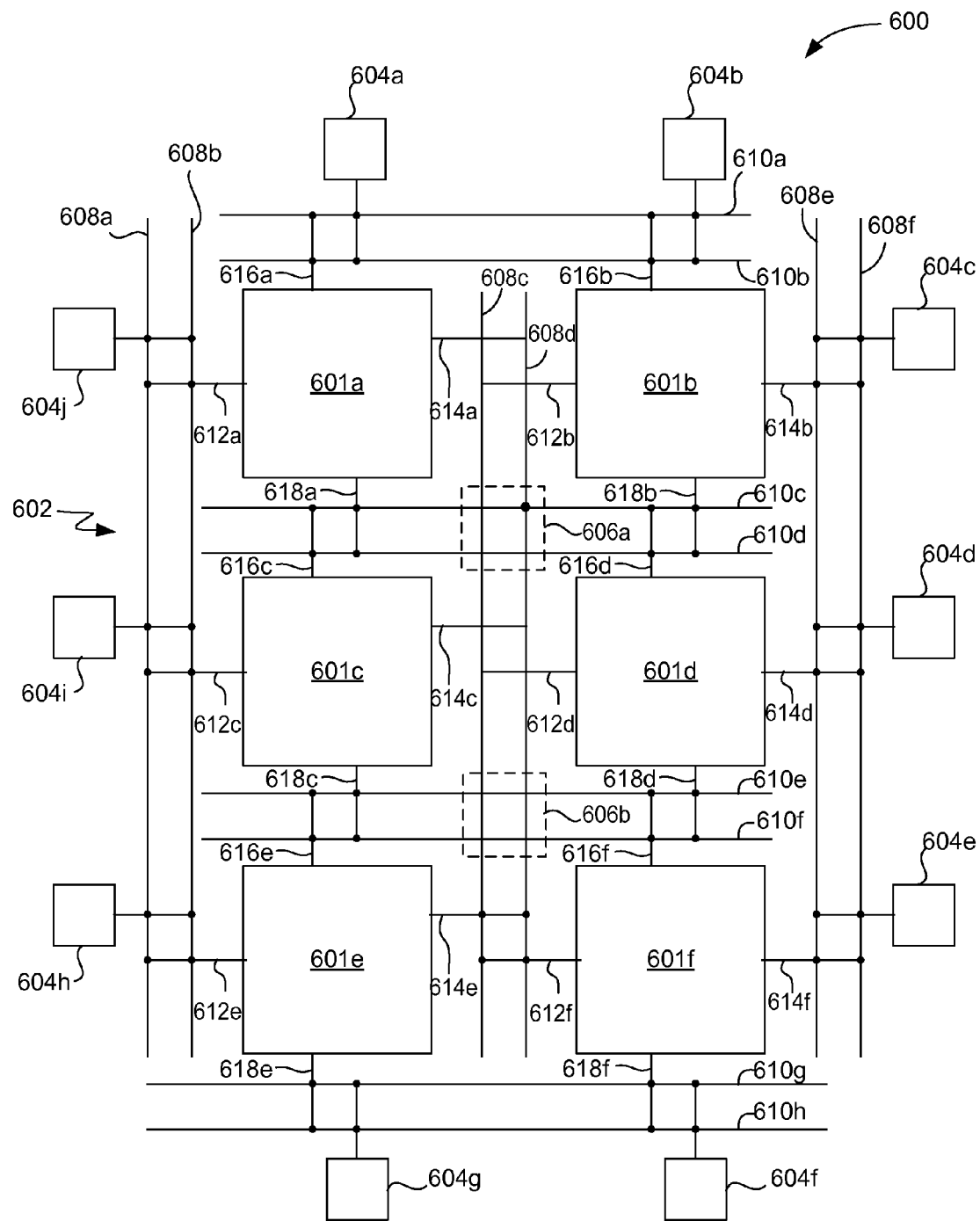
FIG. 6 is an exemplary block diagram showing a device which might implement partial column embedded Input/Output (IO) banks in accordance with one embodiment of the present invention.

FIG. 6 illustrates a PLD which may implement the above described techniques of the present disclosure. Applying the techniques of the present application to a PLD allow for increased flexibility in user design of the PLD as the number of IO interfaces located in close proximity to one another generally increases with embedded partial column IO blocks. This increased proximity provides for increased opportunities to configure the PLD to perform more complex function requiring larger IO data bus widths, for example.

A PLD can comprise a plurality of logic array blocks containing logic elements (LEs), look up tables (LUTs), and other elements, which a user may use as building blocks to implement desired features. For example, referring to FIG. 6, a programmable logic device (PLD) 600 may be a field programmable gate array (FPGA). In various embodiments, PLD 600 may include multiple logic array blocks 601 (LABs), a routing architecture 102, multiple input/output (IO) pads 104, and switches 606. It is appreciated that one or more of the LABs 601 and switches 106 may be configured using configuration data. LABs 601 may be coupled to each other via the routing architecture 602 and/or one or more switches 606. The routing architecture 602 may include multiple vertical LAB lines 608 and multiple horizontal LAB lines 610. LABs 601 may have one or more LAB inputs 612 and one or more LAB outputs 614. LABs 601 may also have, in the vertical direction, one or more LAB inputs 116 and one or more LAB outputs 618. It is noted the signals may also go in the opposite direction with the items designated 612 and 616 representing LAB outputs, and the items designated 614 and 618 representing LAB inputs. IO pads 604 may be coupled to the routing architecture 602.

In one embodiment, LAB 601a may receive an input signal from IO pad 604j through the LAB input 612a. In some embodiments, the LAB 601b may receive an input signal from another LAB, e.g., LAB 601a via LAB input 612b. It is appreciated that LAB 601b may output the received signal via LAB output 614b to the IO pad 604c. The IO pad 604c may send the output signal to an off-chip device (not shown). In certain embodiments, the off-chip device may be located on a chip separate from a chip on which PLD 600 may be located.

Although six LABs 601 are shown in FIG. 6, it is noted that in various embodiments, PLD 600 may include a different number of LABs 601. Moreover, although ten IO pads 604 are shown in FIG. 6, in some embodiments, a different number of IO pads 604 may be used.

Any of LABs 601 may include one or more logic elements (LEs). The logic elements may include n-input look-up tables, flip-flops, such as a D flip-flop or a JK flip-flops, one or more multiplexers, among other things.

Some PLDs provide some blocks of one or more LABs 601 which are configured to perform certain functions which a user may find useful. For example, a PLD manufacturer might program a configuration of LUTs, flip flops and other elements of a PLD to implement an IO interface. In some embodiments, an IO interface block may span multiple rows and/or multiple columns within PLD 100 (FIG. 1).

It is noted that, although some embodiments of the above-described architecture, systems and methods may be implemented with respect to a PLD, for example PLD 600 (FIG. 6), other embodiments involve application of the techniques and mechanisms of the present disclosure to other types of integrated circuits or other devices, such as Application Specific Integrated Circuits (ASICs) and Application Specific Standard Products (ASSPs). Further, although some embodiments of the above-described architecture, systems and methods may be implemented on semiconductor devices packaged using the Ball Grid Array or flip chip techniques, other embodiments may be implemented in the context of other forms of semiconductor device packaging schemes. The above-described embodiments are not meant to limit the scope of the present disclosure. On the contrary, the disclosure is intended to cover alternatives, modifications, and equivalents as may be included within the spirit and scope of the disclosure.

Although the foregoing systems and methods have been described in detail by way of illustration and example for purposes of clarity and understanding, it will be recognized that the above described systems and methods may be embodied in numerous other variations and embodiments without departing from the spirit or essential characteristics of the systems and methods. Certain changes and modifications may be practiced, and it is understood that the systems and methods are not to be limited by the foregoing details, but rather is to be defined by the scope of the appended claims.

What is claimed is:

1. An integrated circuit, comprising:
at least two embedded Input/Output (IO) columns in the core of the integrated circuit, wherein the at least two embedded IO columns are each partial column IO banks which do not extend through to both edges of the integrated circuit, wherein a first embedded partial column IO bank is positioned closer to a first edge IO column than a second edge IO column of the integrated circuit, a second embedded partial column IO bank is positioned closer towards the second edge IO column than the first edge IO column of the integrated circuit, the first and second edge IO columns each being a full column, the full columns larger than the embedded partial column IO banks;
wherein the at least two embedded partial column IO banks each comprise a plurality of IO blocks; and
wherein the integrated circuit is formed on a semiconductor die.

2. The integrated circuit of claim 1, wherein the at least two embedded partial column IO banks are located in different halves of the integrated circuit.

3. The integrated circuit of claim 1, wherein the first embedded partial column IO bank is located adjacent to the first edge IO column of the integrated circuit, and the second embedded partial column IO bank is located adjacent to the second edge IO column of the integrated circuit.

4. The integrated circuit of claim 1, wherein the at least two embedded partial columns IO banks do not segment the core of the integrated circuit.

5. The integrated circuit of claim 1, wherein the at least two embedded partial column IO banks are located on a floor plan of the integrated circuit such that routing of electrical signals from the at least two embedded partial column IO banks to the outside of packaging for the semiconductor die can be implemented on one routing layer.

6. The integrated circuit of claim 1, wherein the size and location of the embedded partial column IO banks are determined at least in part by the number of IO blocks required to be located adjacent to one another to provide necessary data bus width for a desired function of the integrated circuit.

7. The integrated circuit of claim 1, wherein the size of each of the at least two embedded partial column IO banks is determined at least in part by minimizing the number of routing layers needed for implementing the semiconductor die's packaging.

8. The integrated circuit of claim 1, wherein a location of each of the at least two embedded partial column IO banks on a floor plan of the integrated circuit is determined based at least in part on reducing segmentation of core powers on the integrated circuit.

9. The integrated circuit of claim 1, wherein a location of each of the at least two embedded partial column IO banks is determined based at least in part on achieving symmetrical routing for the integrated circuit's IO signals.

10. A method, comprising:
receiving dimensions of an integrated circuit, the integrated circuit formed on a semiconductor die;
receiving information regarding a number of required Input/Output (IO) blocks and/or the functions IO blocks are required to perform for the integrated circuit;
determining a number of embedded partial column IO banks for the integrated circuit based at least in part on the number of needed IO blocks and/or the functions the integrated circuit's IO blocks are required to perform;
determining a number of IO blocks to include in each of the embedded partial column IO banks for the integrated circuit;
determining a location in the integrated circuit for each of the embedded partial column embedded IO banks, wherein a first embedded partial column IO bank is positioned closer to a first edge IO column than a second edge IO column of the integrated circuit, a second embedded partial column IO bank is positioned closer towards the second edge IO column than the first edge IO column of the integrated circuit, the first and second edge IO columns each being a full column, the full columns larger than the embedded partial column IO banks; and providing information concerning a floor plan for the semiconductor die, the information including the size and location of each of the embedded partial column IO banks.

11. The method of claim 10, wherein determining the number of embedded partial column IO banks is based at least in part on a number of IO blocks required to be located adjacent to one another to support data bus widths required for a desired function of the integrated circuit.

12. The method of claim 10, wherein the size of the embedded partial column IO banks is determined based at least in part on reducing the number of routing layers needed for implementing the semiconductor die's packaging.

13. The method of claim 10, wherein the location of the partial column embedded IO banks is determined based at least in part on providing symmetrical routing for the integrated circuit's IO signals.

14. The method of claim 10, wherein the location of the partial column embedded IO banks is determined based at least in part on reducing segmentation of core powers on the integrated circuit.

15. A computer-readable medium having instructions stored thereon that, if executed by a computing device, cause the computing device to perform operations, comprising:
receiving dimensions of an integrated circuit, the integrated circuit formed on a semiconductor die;
receiving information regarding a number of required Input/Output (IO) blocks and/or the functions IO blocks are required to perform for the integrated circuit;
determining a number of embedded partial column IO banks for the integrated circuit based at least in part on the number of needed IO blocks and/or the functions the integrated circuit's IO blocks are required to perform;
determining a number of IO blocks to include in each of the embedded partial column IO banks for the integrated circuit;
determining a location in the integrated circuit for each of the embedded partial column embedded IO banks, wherein a first embedded partial column IO bank is positioned closer to a first edge IO column than a second edge IO column of the integrated circuit, a second embedded partial column IO bank is positioned closer towards the second edge IO column than the first edge IO column of the integrated circuit, the first and second edge IO columns each being a full column, the full columns larger than the embedded partial column IO banks; and
providing information concerning a floor plan for the semiconductor die, the information including the size and location of each of the embedded partial column IO banks.

16. A system, comprising:
an integrated circuit formed on a semiconductor die;
packaging enclosing the integrated circuit and providing connections from the integrated circuit to other devices or systems;
wherein the integrated circuit comprises:
at least two embedded Input/Output (IO) columns in the core of the integrated circuit, wherein the at least two embedded IO columns are each partial column IO banks which do not extend through to both edges of the integrated circuit, wherein a first embedded partial column IO bank is positioned closer to a first edge IO column than a second edge IO column of the integrated circuit, a second embedded partial column IO bank is positioned closer towards the second edge IO column than the first edge IO column of the integrated circuit, the first and second edge IO columns each being a full column, the full columns larger than the embedded partial column IO banks; and
wherein the at least two embedded partial column IO banks each comprise a plurality of IO blocks.

17. The system of claim 16, wherein the at least two embedded IO columns are located in different halves of the integrated circuit.

18. The system of claim 16, wherein the first embedded partial column IO bank is located adjacent to the first edge IO column of the integrated circuit, and the second embedded partial column IO bank is located adjacent to the second edge IO column of the integrated circuit.

19. The system of claim 16, wherein the at least two embedded partial columns of IO blocks do not segment the core of the integrated circuit.

20. The system of claim 16, wherein the size and location of the embedded partial column IO banks are determined at least in part by the number of IO blocks required to be located adjacent to one another to provide necessary data bus width for a desired function of the integrated circuit.

21. The system of claim 16, wherein the size of each of the at least two embedded partial column IO banks is determined at least in part by minimizing the number of routing layers needed for implementing the semiconductor die's packaging.

22. The system of claim 16, wherein a location of each of the at least two embedded partial column IO banks is determined based at least in part on achieving symmetrical routing for the integrated circuit's IO signals.

* * * * *